US006917058B2

(12) United States Patent
Niigaki et al.

(10) Patent No.: US 6,917,058 B2
(45) Date of Patent: Jul. 12, 2005

(54) SEMICONDUCTOR PHOTOCATHODE

(75) Inventors: Minoru Niigaki, Hamamatsu (JP); Toru Hirohata, Hamamatsu (JP); Hirofumi Kan, Hamamatsu (JP); Kuniyoshi Mori, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 10 days.

(21) Appl. No.: 10/433,060

(22) PCT Filed: Dec. 18, 2001

(86) PCT No.: PCT/JP01/11095

§ 371 (c)(1), (2), (4) Date: Nov. 17, 2003

(87) PCT Pub. No.: WO02/50858

PCT Pub. Date: Jun. 27, 2002

(65) Prior Publication Data

US 2004/0056279 A1 Mar. 25, 2004

(30) Foreign Application Priority Data

Dec. 18, 2000 (JP) .................................... 2000-384009

(51) Int. Cl.[7] .............................................. H01L 29/24
(52) U.S. Cl. ......................... 257/103; 257/103; 257/10
(58) Field of Search ............................ 257/103, 10, 11, 257/43, 85, 428, 184, 431

(56) References Cited

U.S. PATENT DOCUMENTS 3,958,143 A 5/1976 Bell ............................ 313/94
5,047,821 A 9/1991 Costello et al. ............... 357/30
5,680,007 A 10/1997 Niigaki et al. .............. 313/527
6,002,141 A 12/1999 Niigaki et al. ................ 257/10
6,005,257 A * 12/1999 Estrera et al. ................ 257/11

FOREIGN PATENT DOCUMENTS

| | | |
|---|---|---|
| EP | 0 729 169 A2 | 8/1996 |
| JP | 8-236015 | 9/1996 |
| JP | 9-213206 | 8/1997 |
| JP | 2000-11856 | 1/2000 |
| JP | 2000-21296 | 1/2000 |
| JP | 2000-90816 | 3/2000 |

* cited by examiner

*Primary Examiner*—David Nelms
*Assistant Examiner*—Thinh T Nguyen
(74) *Attorney, Agent, or Firm*—Morgan, Lewis & Bockius LLP

(57) ABSTRACT

In the case of a thick light-absorbing layer 2, a phenomenon of a decrease in the time resolution occurs. However, when the thickness of the light-absorbing layer 2 is limited, a portion of low electron concentration in one electron group is cut out, and hence overlap regions of adjacent electron concentration distributions decrease. Therefore, by shortening the transit time necessary for the passage of electrons, regions of overlapping electron distributions due to diffusion can also be suppressed. Furthermore, the strength of an electric field within a light-absorbing layer can be increased by thinning the light-absorbing layer. Therefore, the time resolution of infrared rays can be remarkably improved by a synergistic action of these effects. If it is assumed that the time resolution is 40 ps (picoseconds), for example, when the thickness of a light-absorbing layer is 1.3 $\mu$m which is nearly equal to the wavelength of infrared, then a possible time resolution is 7.5 ps when this thickness is 0.19 $\mu$m.

3 Claims, 7 Drawing Sheets

SEMICONDUCTOR PHOTOCATHODE

TECHNICAL FIELD

The present invention relates to a semiconductor photocathode.

BACKGROUND ART

Conventional semiconductor photocathodes are described in the U.S. Pat. No. 3,958,143, U.S. Pat. No. 5,047,821, U.S. Pat. No. 5,680,007 and U.S. Pat. No. 6,002,141. Such semiconductor photocathodes are provided with a light-absorbing layer formed from a compound semiconductor which absorbs infrared rays and emits electrons among carriers generated in response to the absorption of infrared rays through an electron transfer layer (an electron emission layer) into a vacuum.

DISCLOSURE OF THE INVENTION

However, the characteristics of these semiconductor photocathodes are not adequate as yet and further improvements are required. The present invention is made in view of such problems, and its object is to provide a semiconductor photocathode whose characteristics can be improved.

A semiconductor photocathode according to the present invention, which includes a light-absorbing layer made of a compound semiconductor absorbing infrared rays, and in the semiconductor photocathode which emits electrons in response to the incidence of infrared rays, the light-absorbing layer is formed between an electron transfer layer, which has an energy band gap wider than an energy band gap of this light-absorbing layer, and a semiconductor substrate, and the thickness of the light-absorbing layer ranges from 0.02 μm to 0.19 μm inclusive.

When the infrared absorption coefficient in a light-absorbing layer increases, the photoelectric conversion efficiency regarding infrared rays also increases. Additionally, the thicker a light-absorbing layer, the larger the total absorbed amount. Electrons generated in response to the incidence of infrared rays are distributed in the thickness direction. In this electron concentration distribution, the more infrared rays progress, the lower the electron concentration will become.

On the other hand, in a light-absorbing layer, the effective depletion layer width increases because the impurity concentration of the light-absorbing layer is set at a low level, with the result that the strength of an electric field formed within the light-absorbing layer decreases. Electrons generated within the light-absorbing layer travel in the direction of an electron transfer layer due to this electric field and diffusion. Additionally, the diffusion of electrons occurs also in the direction of a semiconductor substrate.

In conventional semiconductor photocathodes, the electron transit speed within a light-absorbing layer is relatively low because it is restricted by a small electric field and diffusion. And if the following infrared pulse becomes incident before the completion of the passage of the greater part of electron groups generated in response to the incidence of the present infrared pulse through a light-absorbing layer, it becomes impossible to separate electron groups generated by the incidence of both infrared pulses from each other. In other words, in a light-absorbing layer, there are two electron concentration distributions in the width direction corresponding to two pulses of infrared which come close to each other in a time axis and it becomes impossible to perform the time resolution of the pulses if these electron concentration distributions greatly overlap each other.

In specific technical fields such as the fields of measurement of the lifetime of fluorescence of semiconductor materials and CT scanning, a time resolution on the order of picoseconds is at present required. At present, however, in an infrared region, no photocathode having such a time resolution is known.

In the present invention, a time resolution of a semiconductor photocathode of equal to/less than 7.5 ps is achieved in the infrared region by limiting the thickness of a light-absorbing layer to equal to/less than 0.19 μm, and sensitivity of equal to/more than a noise level is ensured by limiting the thickness of a light-absorbing layer to equal to/more than 0.02 μm.

More specifically, due to the absorption of infrared rays in a light-absorbing layer, the instantaneous electron concentration distribution occurring within the light-absorbing layer decreases exponentially along the thickness direction. However, in a position where the electron concentration in the electron concentration distribution of one electron group is relatively low, electrons in this position and adjacent electron groups overlap each other, and therefore, the time resolution decreases. Furthermore, because the distribution width of electron groups increases due to diffusion during the transit of the electron groups, regions of overlapping electrons increase and the time resolution decreases further.

In the case of a thick light-absorbing layer, such a phenomenon of a decrease in the time resolution occurs. However, when the thickness of a light-absorbing layer is limited as described above, a portion of low electron concentration in one electron group is cut out, and hence the above-described regions in which adjacent electron concentration distributions overlap each other decrease. Therefore, by shortening the transit time necessary for the passage of electrons, regions of overlapping electrons due to diffusion can also be suppressed. Furthermore, the strength of an electric field within a light-absorbing layer can be increased by thinning the light-absorbing layer. Therefore, the time resolution of infrared rays can be remarkably improved by a synergistic action of these effects.

It is assumed that the time resolution is 40 ps (picoseconds), for example, when the thickness of a light-absorbing layer is 1.3 μm which is nearly equal to the wavelength of infrared. In this case, a possible time resolution is 7.5 ps and equal to/less than 1 ps when this thickness is 0.19 μm and 0.02 μm, respectively. Furthermore, infrared sensitivity is high even when a light-absorbing layer has a very thin film thickness of 0.02 μm, and hence it is possible to obtain a sensitivity which is higher by equal to/less than 3 digits than the sensitivity of an Ag—O—Cs photocathode which has hitherto been the only photocathode in this wavelength band.

Also, because it is necessary that an electron transfer layer give a prescribed speed to electrons, a minimum value of the thickness of this layer is set. In the case of the above-described light-absorbing layer, the thickness of the light-absorbing layer is set at a smaller value than the thickness of an electron transfer layer.

Incidentally, it is preferred that a semiconductor substrate be fabricated from InP, that a light-absorbing layer be fabricated from InGaAsP, and that an electron transfer layer be fabricated from InP.

Also, in a case where a graded layer having a gradually changing composition is provided between a light-absorbing layer and an electron transfer layer, a 50% portion of the thickness of the graded layer is regarded as the light-absorbing layer.

BEST MODES FOR CARRYING OUT THE INVENTION

Figure 1:
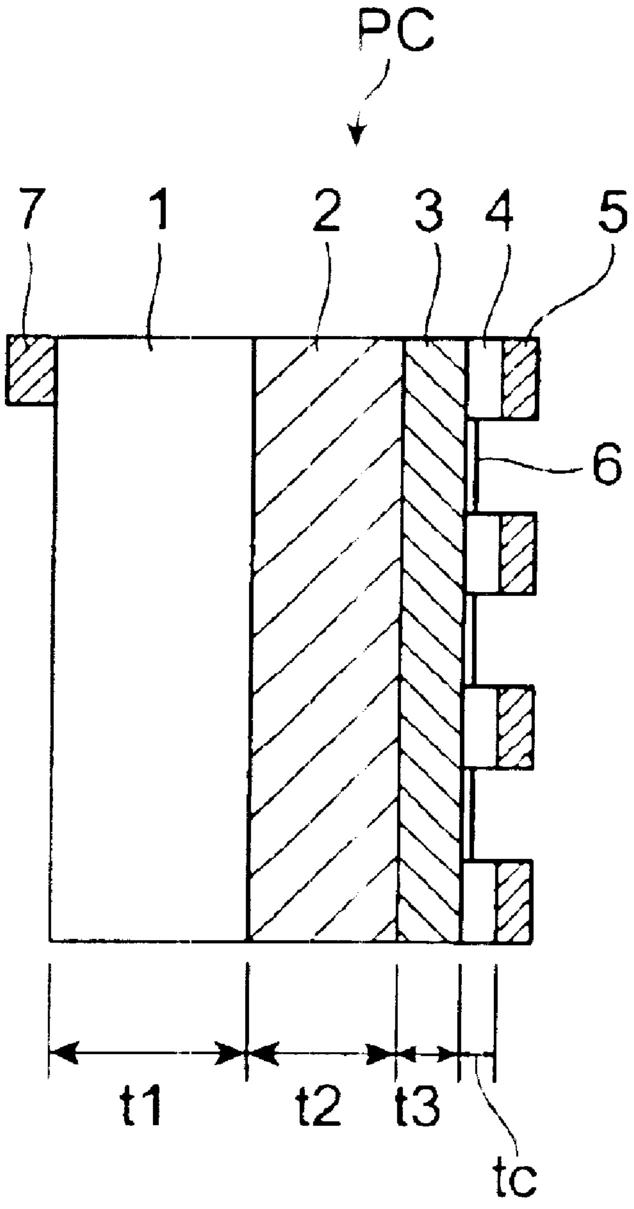
FIG. 1 is a longitudinal sectional view of a semiconductor photocathode PC related to a first embodiment.

Semiconductor photocathodes related to embodiments will be described below. Like reference characters refer to like components and overlapping descriptions are omitted.

(First Embodiment)

FIG. 1 is a longitudinal sectional view of a semiconductor photocathode PC related to a first embodiment. First, the construction of the semiconductor photocathode PC will be described.

The semiconductor photocathode PC of this embodiment, which is disposed in a vacuum opposing to an anode not shown in the figure, includes at least a light-absorbing layer 2, an electrode transfer layer 3, a contact layer 4 and an electrode layer 5 which are sequentially laminated on a semiconductor substrate 1. The contact layer 4 and electrode layer 5 are patterned in mesh (grid) form, and an active layer 6 is formed on an exposed surface of the electron transfer layer 3 at least within openings of this mesh.

Here, the explanation is given here by taking as an example a case where a grid pattern is used as the pattern of the contact layer 4 and electrode layer 5. However, various patterns can be applied as long as the electron transfer layer 3 is exposed in an almost uniform distribution.

Furthermore, a back electrode 7 is provided on the top of the light incidence side of the semiconductor substrate 1 and a voltage is applied between the electrode layer 5 and the back electrode 7 in such a manner that electrons are guided in the direction of the electrode layer 5. Specifically, the electric potential of the electrode layer 5 is relatively set high compared to the electrical potential of the back electrode 7.

When an infrared ray becomes incident from the side of the semiconductor substrate 1 into the light-absorbing layer 2 during this voltage application, a hole-electron pair (a carrier) is generated within the light-absorbing layer 2, and by the action of diffusion and an internal electric field caused by the above-described voltage within the light-adsorbing layer 2, the electron moves in the direction of the electrode layer 5 and the hole moves in the direction of the back electrode 7. Incidentally, the semiconductor substrate 1 is made of a material which is transparent to incident light. Specifically, the energy ban gap of the semiconductor substrate 1 is larger than an energy band gap defined by the wavelength of incident light and hence larger than the energy band gap of the light-absorbing layer 2.

The impurity concentration of the light-absorbing layer 2 is set at a level equal to or lower than the impurity concentration within the electron transfer layer 3.

Electrons generated within the light-absorbing layer 2 flow into the electron transfer layer 3 by the action of diffusion and an internal electric field. The generated electrons obtain energy from the electron transfer layer 3 and accelerate. Incidentally, the energy band gap of the electron transfer layer 3 is larger than the energy band gap of the light-absorbing layer 2.

The strength of an electric field formed in a semiconductor depends on the donor or acceptor concentration and a depletion layer extends from the surface side of the electron transfer layer 3 toward a deep portion. Therefore, in order to ensure efficient acceleration, it is preferable that the impurity concentration of the electron transfer layer 3 be equal to or a little higher than the impurity concentration of the light-absorbing layer 2.

Electrons within the electron transfer layer 3 move by the action of an internal electric field of this layer in the direction of the active layer 6, i.e., in the direction of the surface of the semiconductor photocathode PC.

The active layer 6 is made of a material which lowers the work function, for example, Cs—O or the like. Because the surface of the semiconductor photocathode is opposed to an anode not shown in the figure, electrons which have moved into the active layer 6 are emitted into a vacuum by being guided by an electric potential difference between the relevant photocathode PC and the anode. In this embodiment, the explanation is given by taking the active layer 6 of Cs and O as an example. However, the active layer 6 may be made of any materials as long as they are effective in lowering the work function. However, it has been experimentally made apparent that it is preferable to use alkali metals and their oxides or fluorides. Incidentally, electrons may sometimes be emitted also in a case where the active layer 6 is not existent.

The above-described semiconductor substrate 1, light-absorbing layer 2, electron transfer layer 3 and contact layer 4 are made of compound semiconductors and their types of conduction, materials and preferred ranges of impurity concentration are as shown in the following table.

TABLE 1

| | |
|---|---|
| Semiconductor substrate 1: | p type/InP/no less than $1 \times 10^{15}$ cm$^{-3}$ but no more than $1 \times 10^{17}$ cm$^{-3}$ |
| Light-absorbing layer 2: | p type/InGaAsP/no less than $1 \times 10^{15}$ cm$^{-3}$ but no more than $1 \times 10^{17}$ cm$^{-3}$ |
| Electron transfer layer 3: | p type/InP/no less than $1 \times 10^{15}$ cm$^{-3}$ but no more than $1 \times 10^{17}$ cm$^{-3}$ |
| Contact layer 4: | n type/InP/no less than $1 \times 10^{17}$ cm$^{-3}$ |

Incidentally, the energy band gap of InP is wider than the energy band gap of InGaAsP. Also, as the electrode material of the electrode layer 5, any materials may be used as long as they come into ohmic contact with the contact layer 4.

Furthermore, because this semiconductor photocathode has what is called a transmission type structure which allows detected light to become incident from the back side, the impurity concentration of the semiconductor substrate 1 is set as given above in order to suppress losses due to the absorption by the impurities.

The electron transfer layer 3 and the contact layer 4 form a pn junction and a depletion layer extends from the junction interface into each semiconductor layer. However, because the light-absorbing layer 2 and electron transfer layer 3 cause the depletion layer to reach as far as the light-absorbing layer 2 or semiconductor substrate 1 by the application of a bias voltage, the impurity concentrations of these layers are set at equal to/less than $1\times10^{17}$ $cm^{-3}$.

On the other hand, for the contact layer 4, the impurity concentration is set at equal to/less than $1\times10^{17}$ $cm^{-3}$ in order to extend the depletion layer efficiently to the side of the light-absorbing layer 2 by the application of a bias voltage.

If the thickness of each of the above-described semiconductor substrate 1, light-absorbing layer 2, electron transfer layer 3 and contact layer 4 is denoted by t1, t2, t3 and tc, respectively, then the preferred ranges of thickness/thickness of these layers are as shown in the following table.

TABLE 2

| | |
|---|---|
| t1: | 350 μn/200 μm to 500 μm |
| t2: | 0.1 μm/0.02 μm to 0.19 μm inclusive |
| t3: | 0.5 μm/0.2 μm to 0.8 μm |
| tc: | 0.2 μm/0.1 μm to 0.5 μm |

Here, because the semiconductor substrate 1 and electron transfer layer 3 have a wide energy band gap and are transparent to incident infrared rays, no carrier is generated in these regions outside the light-absorbing layer 2.

In this embodiment, the thickness of the light-absorbing layer 2 is set from 0.02 μm to 0.19 μm inclusive as given above. Specifically, a time resolution of infrared rays of no more than 7.5 ps is achieved by limiting the thickness of the light-absorbing layer 2 to equal to/less than 0.19 μm, and sensitivity of no less than a noise level is ensured by limiting the thickness of this light-absorbing layer to equal to/less than 0.02 μm.

A detailed explanation will be given below. In a case where the light-absorbing layer 2 is thick, a phenomenon of decrease in the time resolution occurs. However, when the thickness of the light-absorbing layer 2 is limited as described above, a portion of low electron concentration in one electron group, which occurs so as to be distributed in the thickness direction in response to the incidence of infrared rays, is substantially cut out by the electron transfer layer 3 which has wide energy band gap. Therefore, regions in which the electron concentration distributions overlap each other decrease, and by shortening the transit time necessary for the passage of electrons, it is also possible to suppress the expansion of regions of overlapping electrons due to the diffusion of electrons. Furthermore, the strength of an electric field within the light-absorbing layer 2 can be increased by thinning the light-absorbing layer. Therefore, the time resolution of infrared rays can be remarkably improved by a synergistic action of these effects.

It is assumed that the time resolution is 40 ps (picoseconds) when the thickness of the light-absorbing layer 2 is 1.3 μm which is nearly equal to the wavelength of infrared. In this case, a possible time resolution is 7.5 ps and equal to/less than 1 ps when this thickness is 0.19 μm and 0.02 μm, respectively. These values are very small compared to a conventional photocathode in which the thickness of a light-absorbing layer 2 is set at 2 μm or so. Furthermore, infrared sensitivity is high even when the light-absorbing layer has a very thin film thickness of 0.02 μm and hence it is possible to obtain a sensitivity which is higher by equal to/more than 3 digits than the sensitivity of an Ag—O—Cs photocathode which only has hitherto been the only photocathode in this wavelength band.

Next, a method of manufacturing the above-described semiconductor photocathode PC will be described below. The semiconductor photocathode PC can be formed by sequentially carrying out the following steps (1) to (9).

(1) A semiconductor substrate 1 is prepared and both surfaces of the semiconductor substrate are polished. Incidentally, a semiconductor substrate 1, both surfaces of which have been polished beforehand, may be used.

(2) A light-absorbing layer 2 is subjected to a vapor-phase growth on the semiconductor substrate 1. In a case where the semiconductor substrate 1 is made of InP and the light-absorbing layer 2 is made of InGaAsP, the chemical vapor deposition process and the molecular beam epitaxial process which are publicly known can be used as the method of forming the light-absorbing layer 2.

(3) An electron transfer layer 3 is caused to grow epitaxially on the light-absorbing layer 2. In a case where the light-absorbing layer 2 is made of InGaAsP and the electron transfer layer 3 is made of InP, the chemical vapor deposition process and the molecular beam epitaxy process which are publicly known can be used as the method of forming the electron transfer layer 3.

(4) A contact layer 4 is caused to grow epitaxially on the electron transfer layer 3. In a case where the electron transfer layer 3 is made of InP and the contact layer 4 is made of InP, the contact layer 4 is formed by use of the same method as with the electron transfer layer 3 with the exception of a difference in the type of conduction.

(5) An electrode layer 5 is formed on the contact layer 4 by use of the vacuum deposition process. Heat treatment is performed as required so that the electrode layer 5 comes into ohmic contact with the contact layer 4.

(6) A photoresist is applied on the electrode layer 5, and the electrode layer 5 and contact layer 4 are patterned by use of an optical lithography technique. Specifically, a mesh-shaped optical pattern is exposed on the photoresist, this photoresist is patterned by etching, the electrode layer 5 and contact layer 4 are etched by use of the patterned photoresist as a mask, and each region of the surface of the electron transfer layer 3 is exposed so as to be almost uniformly positioned in a plane.

(7) A back electrode 7 is formed in part of the semiconductor substrate 1. The vacuum deposition process is used in this forming.

(8) A photocathode intermediate obtained in the above steps is heated in a vacuum and the surface of this intermediate is cleaned.

(9) An active layer 6 containing Cs and O is formed within openings of the above-described mesh in order to lower the work function, whereby the semiconductor photocathode shown in FIG. 1 is completed.

(Second Embodiment)

Figure 2:
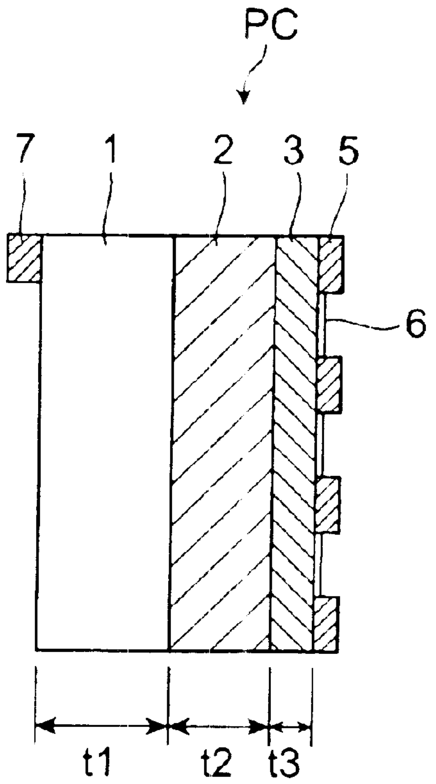
FIG. 2 is a longitudinal sectional view of a semiconductor photocathode PC related to a second embodiment.

FIG. 2 is a longitudinal sectional view of a semiconductor photocathode PC related to a second embodiment. The semiconductor photocathode PC of the second embodiment differs from that of the first embodiment in that the formation of the contact layer 4 shown in FIG. 1 omitted, with the result that the electrode layer 5 and the electron transfer layer 3 are in direct Schottky contact with each other. Any materials can be used as the electrode material in this case as long as they come into Schottky contact with the electron transfer layer 3. However, a selection may be made in consideration of processes such as etching which are to be performed later. Other points of structure including the thickness of each layer and the like are the same as the photocathode of the first embodiment.

For the manufacturing method, the second embodiment differs from the first embodiment in that the formation of the contact layer 4 (Step (4)) is not performed after the formation of the electron transfer layer 3 (Step (3)) but that the electrode layer 5 is formed by vacuum vapor depositing the electrode material directly on the electron transfer layer 3 (Step (5)). Therefore, in the formation of the mesh (Step (6)), only the electrode layer 5 is etched. However, other steps are the same as those in the first embodiment.

(Third Embodiment)

Figure 3:
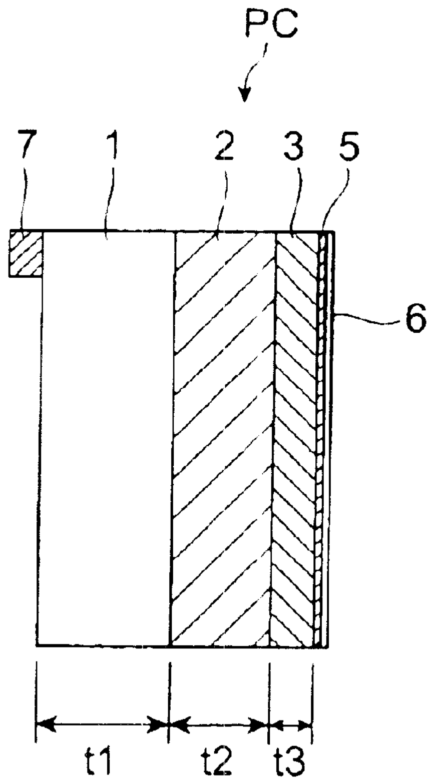
FIG. 3 is a longitudinal sectional view of a semiconductor photocathode PC related to a third embodiment.

FIG. 3 is a longitudinal sectional view of a semiconductor photocathode PC related to a third embodiment. The semiconductor photocathode PC of the third embodiment differs from that of the second embodiment in that the electrode layer 5 shown in FIG. 2 is formed on the whole exposed surface of the electron transfer layer 3, that the thickness of the electrode layer 5 is small, and that the active layer 6 is formed on this thin electrode layer 5. Any materials can be used as the electrode material in this case as long as they come into Schottky contact with the electron transfer layer 3. Other points of structure including the thickness of each layer and the like are the same as those of the photocathode of the second embodiment.

The thickness of the electrode layer 5 has a great effect on the photoelectric conversion quantum efficiency of the photocathode. Specifically, when the thickness is smaller than a specific film thickness, the surface resistance of the electrode layer 5 increases and this may sometimes result in a decrease in the photoelectric conversion quantum efficiency, in particular, when the intensity of incident light is relatively high or in the case of operation at a low temperature. Also, when the electrode layer 5 is too thick, this results in a decrease in the photoelectric conversion quantum efficiency because the probability of electrons passing through the electrode layer 5 decreases.

Therefore, a preferable average thickness of the electrode layer 5 is set from 3 nm to 15 nm inclusive. The reason why an average thickness is referred to here is that there are cases where a thin film of such an extent does not always become a flat film. Any materials can be used as the electrode material in this case as long as they come into Schottky contact with the electron transfer layer 3.

For the manufacturing method, the fourth embodiment differs from the second embodiment in that patterning (Step (6)) is not performed although a thin electrode layer 5 is formed by vacuum depositing the electrode material directly on the electron transfer layer 3 (Step (5)) after the formation of the electron transfer layer 3 (Step (3)) and, therefore, an active layer is formed on the electrode layer 5 (Step (9)). However, other steps are the same as in the first embodiment.

(Forth Embodiment)

Figure 4:
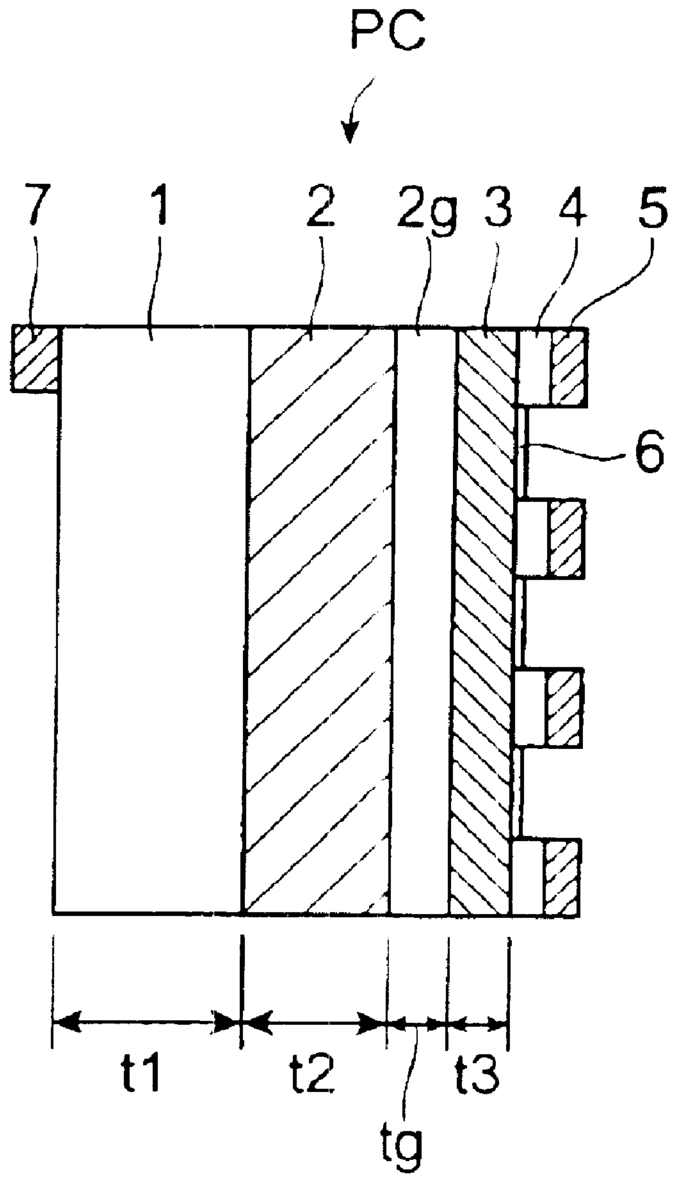
FIG. 4 is a longitudinal sectional view of a semiconductor photocathode PC related to a fourth embodiment.

FIG. 4 is a longitudinal sectional view of a semiconductor photocathode PC related to a fourth embodiment. The semiconductor photocathode PC of the third embodiment differs form that of the first embodiment in that between the light-absorbing layer 2 and the electron transfer layer 3 is interposed a graded layer 2*g* having a gradually changing composition.

In this graded layer 2*g*, a 50% portion of the thickness tg of the graded layer is regarded as the light-absorbing layer 2. Specifically, in a semiconductor photocathode PC of this type, the thickness of the light-absorbing layer 2 is expressed by (t2+tg/2) and this thickness is set from 0.02 μm to 0.19 μm inclusive. Other points of structure including the thickness of each layer and the like are the same as those of the photocathode of the first embodiment.

Also, for the manufacturing method, the fourth embodiment differs from the first embodiment in that the graded layer 2*g* is formed on the light-absorbing layer 2 after the formation of the light-absorbing layer 2 (Step(2)) and before the formation of the electron transfer layer 3 (Step(3)). Therefore, in the formation of the electron transfer layer 3 (Step (3)), the electron transfer layer 3 is formed on the graded layer 2*g*. Therefore, other steps are the same as those in the first embodiment. In the formation of the graded layer 2*g*, the raw material feed rate is adjusted so that the composition of this graded layer changes gradually. However, when the light-absorbing layer 2 is made of InGaAsP and the electron transfer layer 3 is made of InP, it is necessary only that the feed rates of Ga and As be gradually decreased while ensuring lattice matching.

(Photomultiplier Tube)

Next, a description will be given of a photomultiplier tube to which any one of the semiconductor photocathodes PCs described in the above embodiments is applied.

Figure 5:
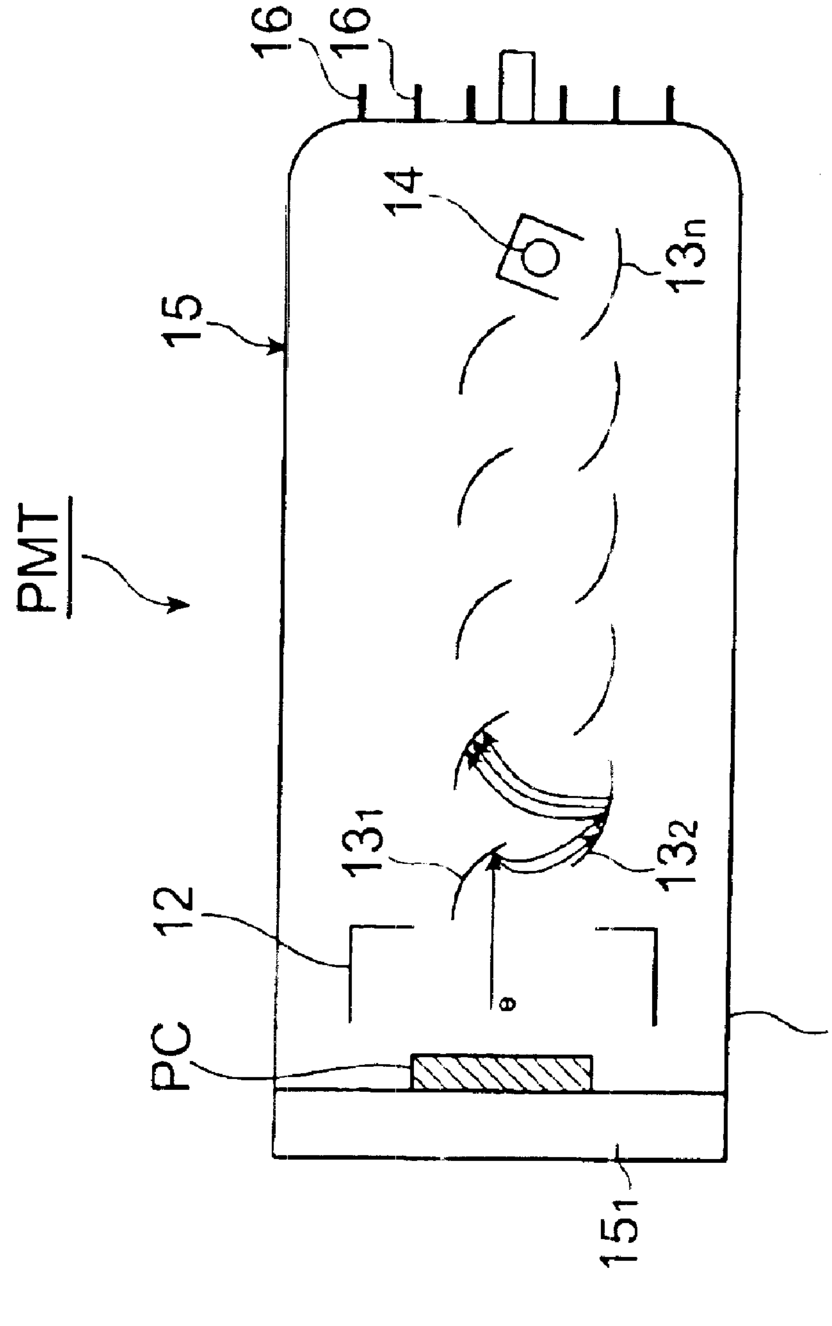
FIG. 5 is a sectional schematic diagram of a photomultiplier tube PMT.

FIG. 5 is a sectional schematic diagram of a photomultiplier tube PMT which is provided with any one of the above-described semiconductor photocathodes PCs. The photomultiplier tube PMT is provided with a photocathode PC, a focusing electrode 12, a first-stage dynode $\mathbf{13}_1$ which works as a secondary-electron multiplication portion, a second-stage dynode $\mathbf{13}_2$, . . . an n-th stage dynode $\mathbf{13}_n$, an anode 14 which collects electrons subjected to secondary-electron multiplication, and a vacuum vessel 15 for housing these elements.

The vacuum vessel 15 is provided with a light entrance window $\mathbf{15}_1$ and a vessel main body $\mathbf{15}_2$ which are included in part of the vacuum vessel 15, and in the bottom portion of the vessel main body $\mathbf{15}_2$ are provided a plurality of stem pins 16. The plurality of stem pins 16 are used to give a bias voltage to the photocathode PC, focusing electrode 12 and each dynode $\mathbf{13}_n$ and to take out the electrons collected at the anode 14.

Next, the operation of the above-described photomultiplier tube PMT will be described below with the aid of FIG. 5. Incidentally, in the following description, FIG. 1 to FIG. 4 should be referred to as required for elements which are denoted by reference numerals of the order of single digit. The greater part of infrared rays which have passed through the light entrance window $\mathbf{15}_1$, which infrared rays are detected light, are absorbed by the light-absorbing layer 2 in the photocathode PC, and photoelectrons e which are excited here are emitted from the exposed surface of the active layer 6 in the direction of the interior of the vacuum vessel 15.

Because the thickness of the light-absorbing layer 2 of the photocathode PC is set from 0.02 μm to 0.19 μm inclusive as described above, the spread in time of the photoelectrons within the photocathode PC is very small. The orbit of the photoelectrons e emitted into the vacuum vessel 15 is corrected by the focusing electrode 12 and the photoelectrons become incident on the fist-stage dynode $\mathbf{13}_1$ with good efficiency. When the photoelectrons e are accelerated and become incident on the first-stage dynode $\mathbf{13}_1$, the first-stage dynode $\mathbf{13}_1$ emits secondary electrons toward the dynode $\mathbf{13}_2$ of the next stage in response to this incidence.

The number of primary electrons which become incident on the fist-stage dynode $\mathbf{13}_1$ is larger than the number of emitted secondary electrons, and the multiplied secondary electrons are emitted toward inside the vacuum vessel 15 and become incident on the second-stage dynode $\mathbf{13}_2$. As in the case of the first-stage dynode $\mathbf{13}_1$, the second-stage dynode $\mathbf{13}_2$ emits secondary electrons into a vacuum. As a result of a repetition of this multiplication action, at the anode 14 positioned in the vicinity of the final-stage dynode, electrons whose number is a million times as large as the number of the photoelectrons emitted from the photocathode PC are collected, and these electrons are taken out of the stem pins 16 to outside the vessel as signal currents (negative).

The photomultiplier tube PMT in this example has a very small spread in time of photoelectrons within the photocathode PC and is excellent in response and sensitivity.

Incidentally, although a photomultiplier tube PMT having dynodes in multiple stages was exemplified above, the structure of a photomultiplier tube to which the above-described photocathode PC can be applied is not limited to this. For example, the above-described photocathode PC can also be applied to what is called an MCP-PMT in which a micro-channel plate (MCP) is used in a secondary-electron multiplication portion. Because in portions other than a fluorescent substance, the structure in this case is almost the same as that of an image intensifier, which will be described later, a description of this structure is omitted here.

(Image Intensifier Tube)

Next, a description will be given of an image intensifier tube to which any one of the semiconductor photocathodes PCs described in the above embodiments is applied.

Figure 6:
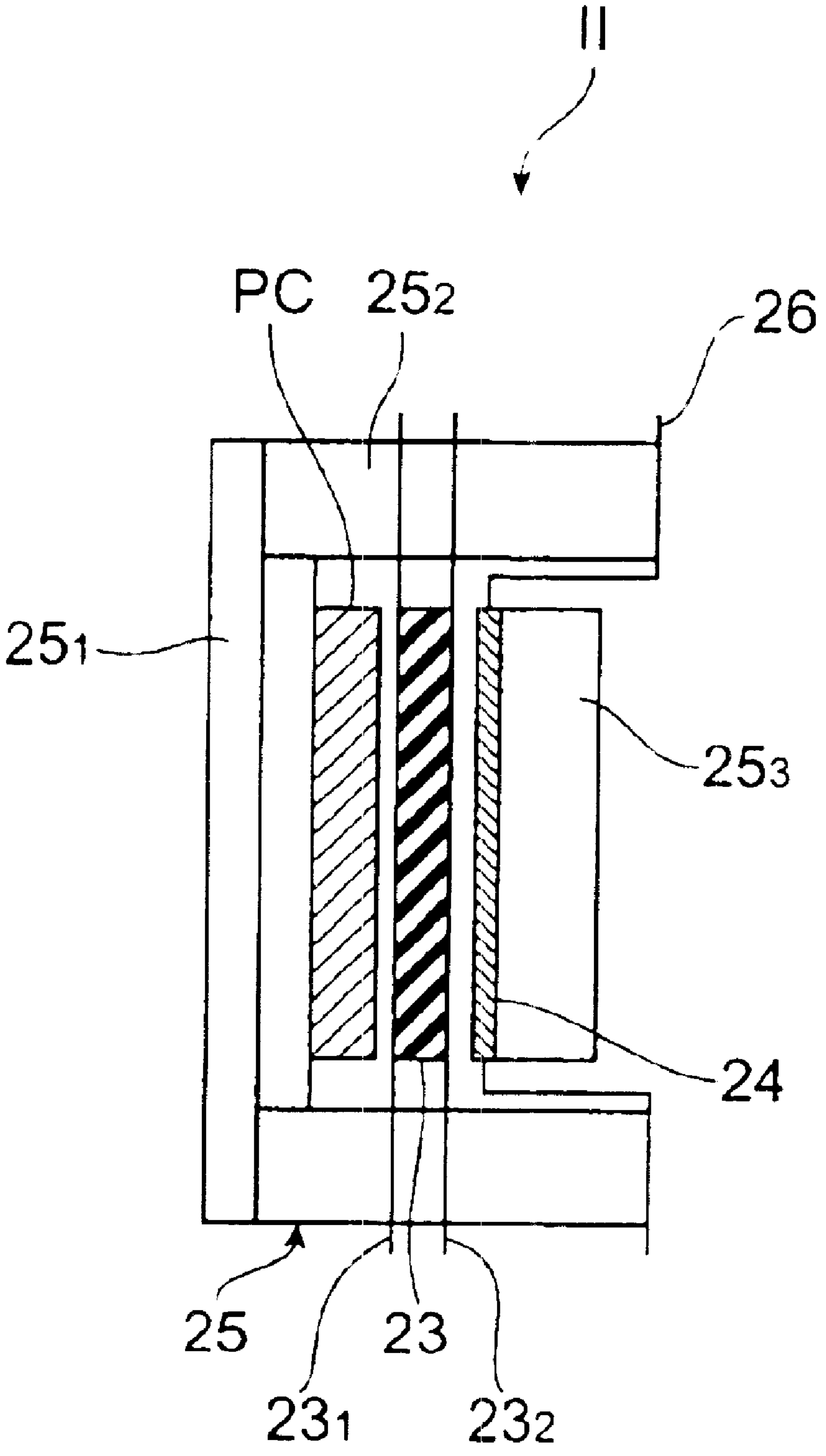
FIG. 6 is a sectional schematic diagram of an image intensifier II.

FIG. 6 is a sectional schematic diagram of an image intensifier tube II which is provided with any one of the above-described semiconductor photocathodes PCs. This image intensifier tube II is provided with a photocathode PC, an MCP 23 which functions as a secondary-electron multiplication portion, a fluorescent substance 24 for converting secondary electrons emitted from the MCP 23 into light, and a vacuum vessel 25 for housing these parts.

The vacuum vessel 25 is provided with a light entrance window $\mathbf{25}_1$, a side tube portion $\mathbf{25}_2$, and an output window $\mathbf{25}_3$ for taking out light emission from the fluorescent substance 24 to outside the image intensifier tube II. In addition, the image intensifier tube is provided with an electrode 26 for giving an appropriate bias voltage to the photocathode PC, MCP 23 and fluorescent substance 24.

Next, the operation of the image intensifier tube will be described below. The greater part of infrared rays which have passed through the light entrance window $\mathbf{25}_1$ as detected light, are absorbed by the light-absorbing layer 2 in the photocathode PC, photoelectrons are excited inside the photocathode PC in response to this absorption, and these photoelectrons are emitted from the exposed surface of the active layer 6 into a vacuum.

Because the thickness of the light-absorbing layer 2 of the photocathode PC is set from 0.02 $\mu$m to 0.19 $\mu$m inclusive as described above, the spread in time of the photoelectrons within the photocathode PC is very small. The photoelectrons which have been emitted into a vacuum are accelerated and become incident on the MCP 23, with the result that secondary electrons are generated in the MCP 23. A voltage of 1 kV or so is applied between an input side electrode $\mathbf{23}_1$ and an output side electrode $\mathbf{23}_2$, and the photoelectrons emitted to the MCP 23 are multiplied to about $1\times10^5$ or so and emitted again as secondary electrons from the MCP 23 into a vacuum.

A voltage of kilovolts is applied to the electrode 26 provided in the fluorescent substance 24, the secondary electrons emitted from the MCP 23 become incident on the fluorescent substance 24 in an accelerated condition, and the fluorescent substance 24 emits light in response to this incidence. The light emission of the fluorescent substance 24 is taken through the output window $\mathbf{25}_3$ to outside the image intensifier II.

In this example, the spread in time of the photoelectrons within the photocathode PC is very small and an image intensifier excellent in response and sensitivity can be realized.

Incidentally, in this example, an image intensifier tube II in which the fluorescent substance 24 is used was described. When the fluorescent substance 24 is replaced with an anode, the image intensifier tube II becomes an MCP-PMT.

Also, in this example, a description was given of a case where only one MCP 23 is used. However, it is also possible to increase the multiplication ratio by combining a plurality of MCPs in a cascade.

(Streak Camera Device)

Next, a description will be given of a streak camera device in which a streak tube 54 provided with the above-described photocathode PC is used.

Figure 7:
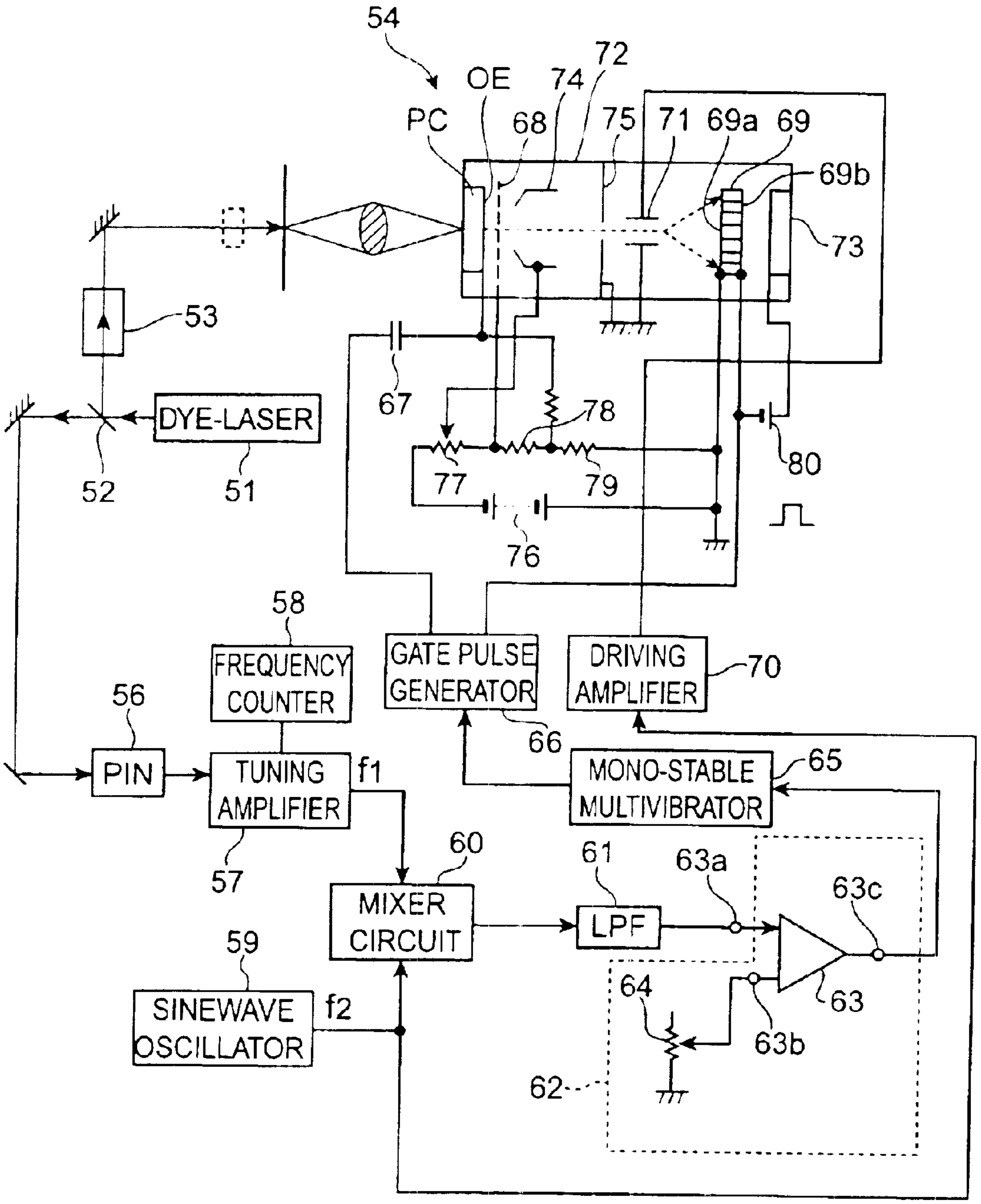
FIG. 7 is a block diagram of a streak camera device.

FIG. 7 is a block diagram of this streak camera device. This streak camera device performs pulse light observation.

The streak tube 54 is provided, at the front thereof, with any one of the photocathodes PCs related to the above-described embodiment and the photocathod PC performs the photoelectric conversion of incident light. The above-described photocathode PC is provided on the plane of incidence of a airtight vessel 72 of the streak tube 54 and a fluorescent screen 73 is formed on the other plane. On the photocathode PC, a mesh electrode 68 is formed long in a direction perpendicular to the sweep direction, and a focusing electrode 74, an aperture electrode 75, a deflecting electrode 71 and an MCP 69 are sequentially arranged as shown in the figure.

A dye laser (an oscillator) 51 emits a laser pulse at a repetitive frequency from 80 to 200 MHz. The wavelength of the laser pulse is in the infrared region and the pulse width of this laser is 5 ps. The output light of the dye laser 51 is split into two systems by a semi-transparent mirror (a beam splitter) 52.

One pulse laser light split by the semi-transparent mirror 52 becomes incident on the photocathode PC of the streak tube 54 through an optical system including an optical path variable device 53*a*, a reflecting mirror 53*b*, a slit lens 53*c*, a slit 53*d* and a condenser lens 53*e*.

The other pulse laser light split by the semi-transparent mirror 52 is reflected by reflecting mirrors 55*a* and 55*b* and becomes incident on a photoelectric converter element (a PIN photodiode) 56. An avalanche photodiode may be used as the photoelectric converter 56. Because of its high response speed, the PIN photodiode 56 outputs a pulse current in response to the incidence of the pulse laser light beam. The output of the PIN photodiode 56 is given to a tuned amplifier 57 and this tuned amplifier 57 operates at a repetitive frequency in the range from 80 to 200 MHz as a center frequency.

This center frequency is set to be equal to the oscillation frequency of the dye laser 51, and the tuned amplifier 57 sends a primary sine wave synchronized with the repetitive frequency of the output pulse of the PIN photodiode 56. The semi-transparent mirror 52, reflecting mirrors 55*a* and 55*b*, photoelectric converter element 56 and tuned amplifier 57 constitute a primary sine wave oscillator. This primary sine wave oscillator generates the primary sine wave which comes into synchronization with the high-speed repetitive pulse light which is inputted to the photocathode PC of the streak tube 54.

A frequency counter 58 measures and displays the frequency of the primary sine wave sent by the tuned amplifier 57.

Also, a sine wave oscillator 59 constitutes a secondary sine wave oscillator which generates a secondary sine wave whose frequency is a little different from that of a primary sine wave. This sine wave oscillator 59 can send a sine wave of an arbitrary frequency in the frequency range from 80 to 200 MHz. A mixer circuit 60 mixes the output of the primary sine wave oscillator (f1) and the output of the secondary sine wave oscillator (f2) together. A low-pass filter (LPF) 61 takes out low-frequency components from the output of the mixer circuit 60 and the LPF 61 and a level detector 62 constitute a phase detector.

This phase detector generates a detection output by detecting a point of time when a certain phase relation to the output of the primary sine wave oscillator is generated.

In a case where the dye laser 51 is sending infrared pulse light at a repetitive frequency of 100 MHz, a primary sine wave of 100 MHz is sent from the tuned amplifier 57. On the frequency counter 58 is displayed "100 MHz." An operator reads the display of the frequency counter 58 and adjusts this sine wave oscillator 59 so that the sine wave oscillator 59 sends a secondary sine wave of 100+Δf (MHz) Here, Δf<<100.

The mixer circuit 60 mixes together the output of the primary sine wave oscillator, that is, the primary sine wave f1 (100 MHz) sent by the tuned amplifier 57, and the secondary sine wave f2 (100+Δf MHz) sent by the secondary oscillator 59, thereby sending a combined wave of f=f1+f2.

Here, the frequency f of the combined wave is expressed by the following equation:

$$\begin{aligned} f &= f1 \times f2 \\ &= A\sin(2\times10^8\pi)t \times B\sin(2\times10^8\pi + 2\pi\Delta f)t \\ &= \frac{A\times B}{2}\cdot[\cos(2\pi\Delta f) - \cos(4\times10^8\pi + 2\pi\Delta f)]t \end{aligned}$$

The LPF 61 causes components of a domain of a frequency lower than a frequency which is a little higher than the frequency Δf to pass through. Therefore, the LPF 61 causes only components of f'=(A×B/2) cos 2πΔft to pass through from the output waves of the mixer circuit 60. The output terminal of the LPF 61 is connected to one input terminal 63*a* of a comparator 63 which constitutes a level detector 62 and a sine wave f' is input to the input terminal 63*a* of the comparator 63.

To the other input terminal 63*b* of the comparator 63 is connected a sliding shaft of a potentiometer 64. When a voltage input to one input terminal 63*a* becomes larger than a voltage input to the other input terminal 63*b*, the comparator 63 sends a pulse. An output terminal 63*c* of the comparator 63 is connected to an input terminal of a monostable multi-vibrator 65. This monostable multi-vibrator 65 is started at a rising edge of an output pulse and stops up after a lapse of a certain time.

A gate pulse generator 66 is connected to an output terminal of the monostable multi-vibrator 65. The gate pulse generator 66 sends a gate voltage when an output of the monostable multi-vibrator 65 is in an on state. An output electric potential of this gate pulse generator 66 is given to an ohmic electrode OE electrically connected to the photocathode PC through a capacitor 67 and an output electrode 69*b* of an MCP 69.

In this example, an electric potential of −800 V is given to the ohmic electrode OE and an electric potential of +900 V is given to the output electrode 69*b*. Incidentally, the electric potentials of an input electrode 69*a* of the MCP 69 and of an aperture electrode 75 are 0 V (grounding).

On the other hand, the secondary sine wave which is an output of the sin wave oscillator 59 is amplified by a driving amplifier 70 and applied to a deflecting electrode 71 of the streak tube 54. The amplitude of the sine wave applied to this deflecting electrode 71 is 575 V and the center of the amplitude shows 0 V. In other words, a potential difference between a maximum value and a minimum value of an electric potential applied to one side of the deflecting electrode 71 is 1150 V.

Here, the distance between the deflecting electrode 71 and the MCP 69 and the sizes of these parts are set so that only photoelectrons deflected by the sweep performed by the deflecting electrode 71 in response to the application of a voltage between +100 V and −100 V become incident on the MCP 69.

Also, both ends of a power source 76 are short-circuited through resistors 77, 78, 79 having a very large resistance value, and by taking out the electric potentials between the resistors, an electric potential of 4000 V is given to the ohmic electrode OE of the photocathode PC and an electric potential of −4500 V is given to the focusing electrode 74. Incidentally, a power source 80 gives a voltage which is 300 V higher than that of the output electrode 69*b* of the MCP 69 to the fluorescent screen 73.

When a gate voltage is not applied from the gate pulse generator 66, photoelectrons are not emitted from the photocathode PC. Therefore, multiplied electrons are not emitted from the MCP 69 either and hence the fluorescent screen 73 is kept in a dark state.

When a gate voltage is applied from the gate pulse generator 66, photoelectrons within the photocathode PC are accelerated by the electric potential of the mesh electrode 68 and emitted into a vacuum within the airtight vessel 72.

Emitted photoelectrons are focused within an opening of the aperture electrode 75 by an electronic lens formed by the focusing electrode 74 and enter a region between two electrode plates of the deflecting electrode 71. At this time, when a voltage is applied to the deflecting electrode 71, the photoelectrons are deflected.

In this example, the position of incidence of photoelectrons on the MCP 69 is designed so that it moves from the top end on the drawing to the bottom end when a deflecting voltage changes from +100 V to −100 V. Photoelectrons which have become incident on the MCP 69 are multiplied and become incident on the fluorescent screen 73, forming a streak image.

Next, a description will be given of the time resolution of a photocathode obtained in a case where the semiconductor photocathode PC described in the first embodiment is fabricated and built in the streak camera device shown in FIG. 7. Because the time resolution which the streak tube itself has and the time width of incident pulse light have been evident beforehand, data on the time resolution of the photocathode is corrected here.

The time resolution was 40 ps in a case where infrared rays were used as incident light and the thickness of the light-absorbing layer 2 was 1.3 μm which is nearly equal to the wavelength of infrared. The time resolution became 7.5 ps and equal to/less than 1 ps when the thickness of the light-absorbing layer 2 was 0.19 μm and 0.02 μm, respectively.

Figure 8:
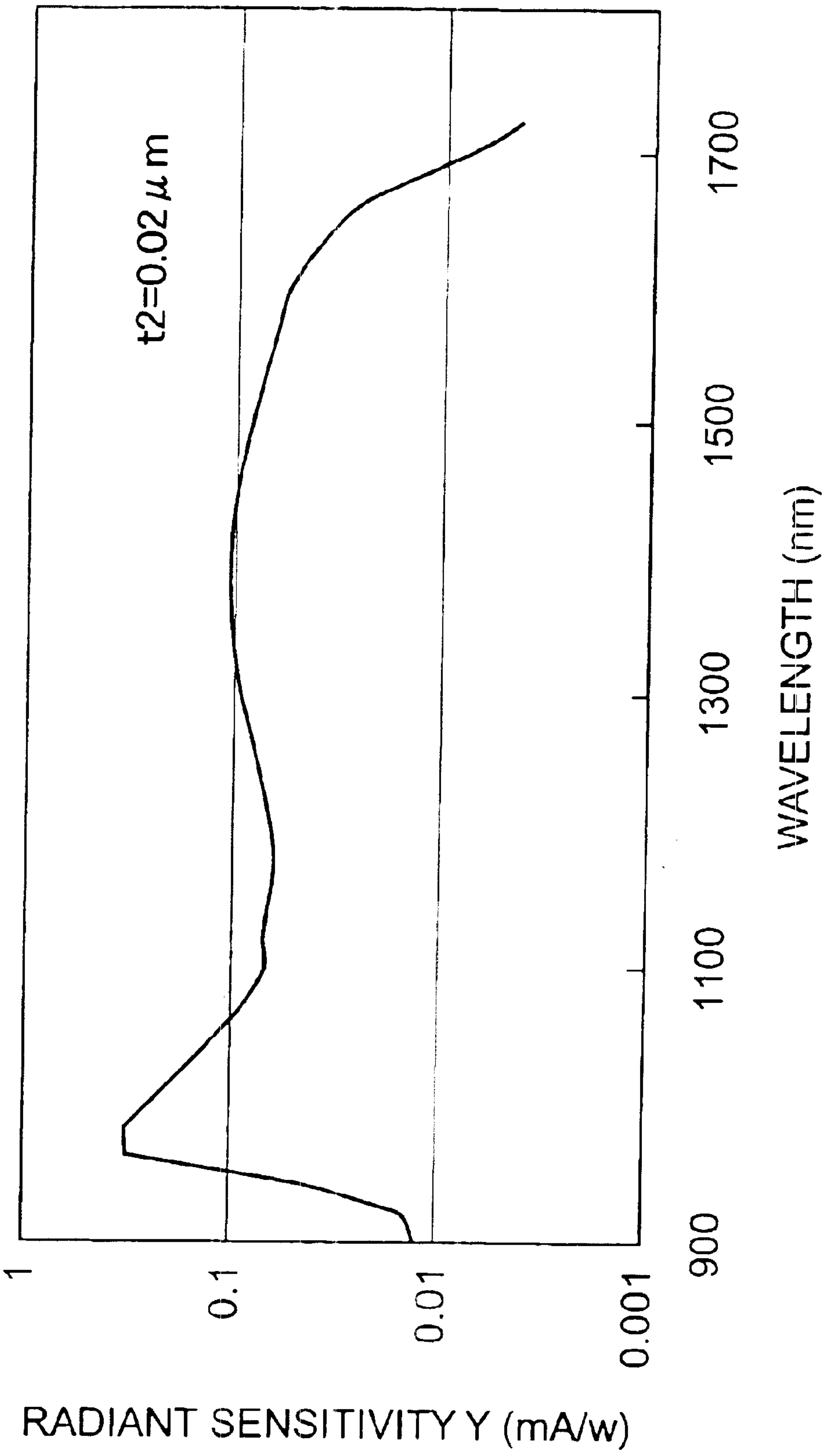
FIG. 8 is a graph showing the spectral sensitivity characteristic of a photocathode PC.

FIG. 8 is a graph showing the spectral sensitivity characteristic of a photocathode PC when the thickness t2 of the light-absorbing layer 2 of the photocathode PC is 0.02 μm. The infrared sensitivity in the wavelength range from 950 nm to 1050 nm is equal to/more than 0.1 mA/W even when the thickness t2 of the light-absorbing layer 2 provides a very thin film thickness of 0.02 μm. In addition, this sensitivity is higher by equal to/more than 3 digits than the sensitivity of an Ag—O—Cs photocathode which has hitherto been the only photocathode in this wavelength band. Incidentally, when the thickness t2 of the light-absorbing layer 2 is smaller than 0.02 μm, this measurement is difficult because the photoelectric sensitivity decreases to below a noise level.

As described above, by setting the thickness t2 of the light-absorbing layer 2 at a range from 0.02 μm to 0.19 μm inclusive, an increase in response speed and an improvement in sensitivity can be attained to such an extent that has not hitherto been expected.

Incidentally, even in a case where the graded layer 2*g* shown in FIG. 4 is used, it only follows that the probability of photoelectrons crossing a hetero-interface between the light-absorbing layer 2 and the electron transfer layer 3 increases, and therefore, similar effects can be achieved. Thus it might be thought that time resolution measurement of the order of picoseconds can be carried out.

Furthermore, also in the structures shown in FIGS. 2 and 3, in view of the above principle, it might be thought that an increase in response speed and an improvement in sensitivity can be achieved. Also, materials other than InGaAsP can also be used as the material for the light-absorbing layer 2 as long as they are materials having a fundamental absorption edge in infrared.

INDUSTRIAL APPLICABILITY

The present invention can be used in semiconductor photocathodes.

What is claimed is:

1. A semiconductor photocathode which includes a light-absorbing layer made of a compound semiconductor absorbing infrared rays and emits electrons in response to the incidence of infrared rays, wherein the light-absorbing layer is formed between an electron transfer layer, which has an energy band gap wider than an energy band gap of this light-absorbing layer, and a semiconductor substrate and the thickness of the light-absorbing layer ranges from 0.02 μm to 0.19 μm inclusive.

2. The semiconductor photocathode according to claim 1, wherein the light-absorbing layer is thinner than the electron transfer layer.

3. The semiconductor photocathode according to claim 1, wherein the semiconductor substrate is made of InP, the light-absorbing layer is made of InGaAsP, and the electron transfer layer is made of InP.

* * * * *